(12) United States Patent
Chou et al.

(10) Patent No.: US 10,840,134 B2
(45) Date of Patent: Nov. 17, 2020

(54) INTERCONNECT STRUCTURE AND METHOD

(71) Applicant: Taiwan Semiconductor Manufacturing Company, Ltd., Hsinchu (TW)

(72) Inventors: Chia-Cheng Chou, Keelung (TW); Chih-Chien Chi, Hsinchu (TW); Chung-Chi Ko, Nantou (TW); Yao-Jen Chang, Taipei (TW); Chen-Yuan Kao, Zhudong Township (TW); Kai-Shiang Kuo, Hsinchu (TW); Po-Cheng Shih, Hsinchu (TW); Tze-Liang Lee, Hsinchu (TW); Jun-yi Ruan, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/391,035

(22) Filed: Apr. 22, 2019

(65) Prior Publication Data

US 2019/0252246 A1 Aug. 15, 2019

Related U.S. Application Data

(60) Continuation of application No. 15/687,230, filed on Aug. 25, 2017, now Pat. No. 10,269,627, which is a
(Continued)

(51) Int. Cl.
*H01L 21/768* (2006.01)
*H01L 23/532* (2006.01)
(Continued)

(52) U.S. Cl.
CPC .... *H01L 21/76835* (2013.01); *H01L 21/7684* (2013.01); *H01L 21/76816* (2013.01);
(Continued)

(58) Field of Classification Search
CPC .......... H01L 21/76835; H01L 23/5283; H01L 21/76879; H01L 29/7851; H01L 29/66545;
(Continued)

(56) References Cited

U.S. PATENT DOCUMENTS 5,977,640 A 11/1999 Bertin et al.
6,365,506 B1 4/2002 Chang et al.
(Continued)

FOREIGN PATENT DOCUMENTS

CN 1391266 A 1/2003
CN 1881558 A 12/2006
(Continued)

*Primary Examiner* — Thinh T Nguyen
(74) *Attorney, Agent, or Firm* — Slater Matsil, LLP

(57) ABSTRACT

A device, structure, and method are provided whereby an insert layer is utilized to provide additional support for surrounding dielectric layers. The insert layer may be applied between two dielectric layers. Once formed, trenches and vias are formed within the composite layers, and the insert layer will help to provide support that will limit or eliminate undesired bending or other structural motions that could hamper subsequent process steps, such as filling the trenches and vias with conductive material.

20 Claims, 19 Drawing Sheets

Related U.S. Application Data division of application No. 15/058,864, filed on Mar. 2, 2016, now Pat. No. 9,754,822.

(51) Int. Cl.
  *H01L 29/78* (2006.01)
  *H01L 21/8234* (2006.01)
  *H01L 21/84* (2006.01)
  *H01L 29/66* (2006.01)
  *H01L 23/522* (2006.01)
  *H01L 23/528* (2006.01)
  *H01L 29/08* (2006.01)

(52) U.S. Cl.
  CPC .. *H01L 21/76826* (2013.01); *H01L 21/76829* (2013.01); *H01L 21/76843* (2013.01); *H01L 21/76879* (2013.01); *H01L 21/823431* (2013.01); *H01L 21/823475* (2013.01); *H01L 21/845* (2013.01); *H01L 23/5226* (2013.01); *H01L 23/5283* (2013.01); *H01L 23/53238* (2013.01); *H01L 23/53295* (2013.01); *H01L 29/66545* (2013.01); *H01L 29/7851* (2013.01); *H01L 21/76801* (2013.01); *H01L 21/76807* (2013.01); *H01L 21/76838* (2013.01); *H01L 29/0847* (2013.01); *H01L 2221/1047* (2013.01)

(58) Field of Classification Search
  CPC ........... H01L 23/53295; H01L 23/5226; H01L 21/76816
  USPC .......... 438/621, 622, 623, 629; 257/77, 758, 257/762, 760, 772
  See application file for complete search history.

(56) References Cited

U.S. PATENT DOCUMENTS

| | | |
|---|---|---|
| 6,399,486 B1 | 6/2002 | Chen et al. |
| 6,498,093 B1 | 12/2002 | Achuthan et al. |
| 6,548,224 B1 | 4/2003 | Chen et al. |
| 6,713,874 B1 | 3/2004 | Hopper et al. |
| 6,756,321 B2 | 6/2004 | Ko et al. |
| 6,806,192 B2 | 10/2004 | Lin et al. |
| 6,890,850 B2 | 5/2005 | Lee et al. |
| 7,232,762 B2 | 6/2007 | Chang et al. |
| 7,638,859 B2 | 12/2009 | Lu et al. |
| 7,667,271 B2 | 2/2010 | Yu et al. |
| 7,714,392 B2 | 5/2010 | Chang et al. |
| 7,898,037 B2 | 3/2011 | Chuang et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Vann et al. |
| 8,823,065 B2 | 9/2014 | Wang et al. |
| 8,860,148 B2 | 10/2014 | Hu et al. |
| 9,502,649 B2 | 11/2016 | Huang et al. |
| 9,761,799 B2 | 9/2017 | Huang et al. |
| 9,812,363 B1 | 11/2017 | Liao et al. |
| 10,038,095 B2 | 7/2018 | Li et al. |
| 10,522,408 B2 | 12/2019 | Liao et al. |
| 2003/0054115 A1 | 3/2003 | Albano et al. |
| 2003/0129827 A1 | 7/2003 | Lee et al. |
| 2004/0147104 A1 | 7/2004 | Lin et al. |
| 2005/0140029 A1 | 6/2005 | Li et al. |
| 2005/0282395 A1 | 12/2005 | Chang et al. |
| 2006/0051958 A1 | 3/2006 | Ho |
| 2006/0183259 A1 | 8/2006 | Lai et al. |
| 2006/0199373 A1 | 9/2006 | Miyajima et al. |
| 2006/0276027 A1 | 12/2006 | Lu et al. |
| 2007/0205414 A1 | 9/2007 | Chang et al. |
| 2007/0232046 A1 | 10/2007 | Miyata et al. |
| 2008/0258228 A1 | 10/2008 | Chuang et al. |
| 2010/0055899 A1 | 3/2010 | Mayer et al. |
| 2011/0210444 A1 | 9/2011 | Jeng et al. |
| 2012/0043663 A1 | 2/2012 | Ko et al. |
| 2014/0001574 A1 | 1/2014 | Chen et al. |
| 2014/0029181 A1* | 1/2014 | Gstrein et al. ...... H01L 23/5329 438/637 |
| 2014/0110755 A1 | 4/2014 | Colinge |
| 2014/0151812 A1 | 6/2014 | Liaw |
| 2014/0175617 A1 | 6/2014 | Antonelli et al. |
| 2014/0356549 A1 | 12/2014 | Varadarajan |
| 2014/0374797 A1 | 12/2014 | Kwon et al. |
| 2015/0061149 A1 | 3/2015 | Lin et al. |
| 2015/0187696 A1 | 7/2015 | Tsai et al. |
| 2015/0235943 A1 | 8/2015 | Suzumura et al. |
| 2016/0293484 A1 | 10/2016 | Lee et al. |
| 2017/0110501 A1 | 4/2017 | Hsu et al. |
| 2019/0311955 A1 | 10/2019 | Xu et al. |

FOREIGN PATENT DOCUMENTS

| | | |
|---|---|---|
| CN | 103871963 A | 6/2014 |
| JP | 2006237349 A | 9/2006 |
| JP | 2006344965 A | 12/2006 |
| JP | 2009532866 | 9/2009 |
| KR | 20150000235 A | 1/2015 |
| KR | 20150079430 A | 7/2015 |
| TW | 200522257 A | 7/2005 |
| TW | I238490 B | 8/2005 |
| TW | I315558 | 10/2009 |
| TW | 201145452 A | 12/2011 |
| TW | I559990 B | 12/2016 |

* cited by examiner

INTERCONNECT STRUCTURE AND METHOD

PRIORITY CLAIM AND CROSS-REFERENCE

This application is a continuation of U.S. patent application Ser. No. 15/687,230, filed on Aug. 25, 2017, and entitled, "Interconnect Structure and Method," which is a divisional of U.S. patent application Ser. No. 15/058,864, filed on Mar. 2, 2016, and entitled "Interconnect Structure and Method," now U.S. Pat. No. 9,754,822, issued on Sep. 5, 2017, which application is incorporated herein by reference.

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its k-value, and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
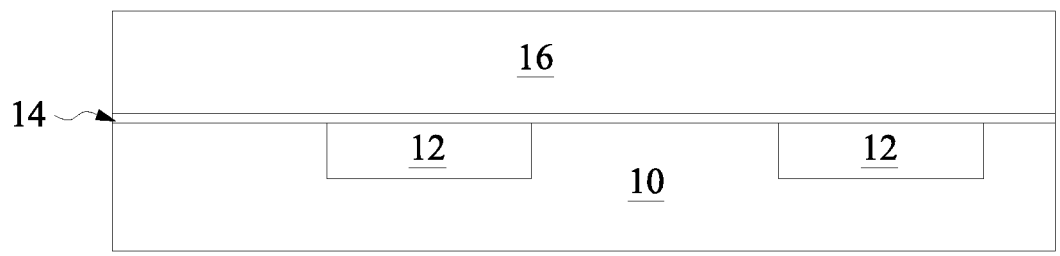
FIGS. 1 through 6 are cross-sectional views of intermediate stages in the manufacturing of an interconnect structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures and methods of forming the same are provided in accordance with various embodiments. Intermediate stages of forming interconnect structures are illustrated. Some embodiments discussed herein are discussed in the context of interconnects formed using a dual damascene process. In other embodiments, a single damascene process may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

With reference now to FIG. 1, FIG. 1 illustrates a substrate 10 with active devices (not shown), metallization layers (not shown) in the substrate 10, a conductive element 12 coupled to the metallization layers, an optional etch stop layer 14, and a first dielectric layer 16. The substrate 10 may be a semiconductor substrate, such as a bulk semiconductor, a semiconductor-on-insulator (SOI) substrate, or the like, which may be doped (e.g., with a p-type or an n-type dopant) or undoped. The substrate 10 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 10.

The metallization layers are formed over active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to four layers of metallization separated from each other by at least one interlayer dielectric layer (ILD), but the precise number of metallization layers is dependent upon the design.

The conductive element 12 may be formed in or over the metallization layers, and is a region to which an interconnect 24 (not illustrated in FIG. 1 but illustrated and described below in FIG. 6) will make physical and electrical connection. In an embodiment the conductive element 12 may be a material such as copper formed using, e.g., a damascene or dual damascene process, whereby an opening is formed within the metallization layers, the opening is filled and/or overfilled with a conductive material such as copper, and a planarization process is performed to embed the conductive material within the metallization layers. However, any suitable material and any suitable process may be used to form the conductive element 12.

The etch stop layer 14 may be formed over the substrate 10, any metallization layers, and the conductive elements 12. In some embodiments, the etch stop layer 14 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

The first dielectric layer 16 may be formed in order to help isolate the interconnect 24 from other adjacent electrical routing lines. In an embodiment the first dielectric layer 16 may be, e.g., a low-k dielectric film intended to help isolate the interconnect 24 from other structures. By isolating the interconnect 24, the resistance-capacitance (RC) delay of the interconnect 24 may be reduced, thereby improving the overall efficiency and speed of electricity through the interconnect 24.

In an embodiment the first dielectric layer 16 may be a porous material such as SiOCN, SiCN, SiOC, SiOCH, or the like and may be formed by initially forming a precursor layer over the etch stop layer 14, if present. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 14, may also be utilized.

The precursor layer may be formed to a thickness sufficient to provide the isolation and routing characteristics that are desired of the first dielectric layer 16. In an embodiment, the precursor layer may be formed to a first thickness T1 of in a range from about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the first dielectric layer 16. The porogen may be a material that is big enough to form the pores while also remaining small enough such that the size of the individual pores does not overly displace the matrix material. As such, the porogen may comprise an organic molecule such as alpha-terpinene (ATRP) (1-Isopropyl-4-Methyl-1,3-Cyclohexadiene) or Cyclooctane (boat shape) or 1,2-bis(triethoxysilyl) ethane Silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the first dielectric layer 16. For example, an anneal of in a range from about 200° C. and about 500° C., such as about 400° C., for in a range from about 10 seconds to about 600 seconds, such as about 200 seconds, may be utilized.

However, as one of ordinary skill in the art will recognize, the thermal process described above is not the only method that may be utilized to remove the porogen from the matrix material to form the first dielectric layer 16. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

However, the first dielectric layer 16 as described above does not have the desired resistance to withstand unbalanced stress that can occur during a patterning process. For example, trench openings that are located adjacent to a via opening may deform a different amount than a trench opening that is located further away from the via opening, such as by being the third trench opening removed from the via opening. In a particular example, each of the trench openings may be patterned with a process that attempts to form the trench openings to have a similar width, but because of the unbalanced forces within each opening, a trench opening adjacent to the via opening may have that desired width reduced by 4 nm to 5 nm or 6 nm as compared to the width achieved by a trench opening located away from the via opening. Such reductions and differences between the various trench openings could cause gap-filling problems in subsequent metallization processes (discussed further below).

Figure 2:
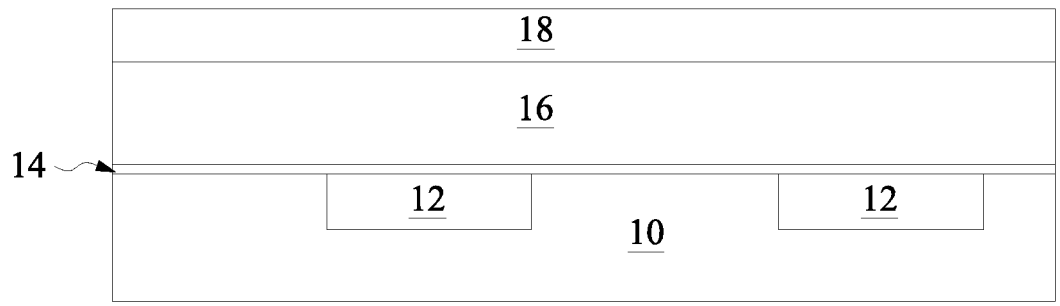

FIG. 2 illustrates forming an insert layer 18 over the first dielectric layer 16 in order to provide a frame for additional structural support to increase the robustness of the first dielectric layer 16 and other subsequently deposited layers. In addition, the inclusion of the insert layer 18 impacts the capacitance less than simply changing the bulk film from being a low-k dielectric film. In an embodiment the insert layer 18 is a material with a larger hardness and a higher K-value than the first dielectric layer 16. For example, in an embodiment in which the first dielectric layer 16 has a hardness of in a range from about 1.5 GPa to about 3.0 GPa, such as about 2 GPa, the insert layer 18 may have a hardness of greater than about 8 GPa, such as in a range from about 10 GPa to about 13 GPa, such as about 12 GPa. In other words, the insert layer 18 may have a hardness that is greater than the first dielectric layer 16 by at least 5 GPa. Similarly, in an embodiment in which the first dielectric layer 16 has a K-value in a range from about 2.3 to about 2.9, the insert layer 18 may have a K-value of greater than about 3.0.

In some embodiments, the insert layer 18 may comprise a material such as $Si_xO_y$ (e.g., $SiO_2$), $Si_xC_y$ (e.g., SiC), $Si_xO_yC_z$ (e.g., SiOC), and $Si_xC_yN_z$ (e.g., SiCN), combinations of these, or the like. However, any suitable material may be used to provide the additional structural support for the first dielectric layer 16.

In an embodiment the insert layer 18 may be formed using a deposition process such as chemical vapor deposition (CVD), atomic layer deposition (ALD), physical vapor deposition (PVD), plasma enhanced CVD (PECVD), spin-on coating, or the like. In other embodiments, such as an embodiment in which $SiO_2$ if formed, an initial layer of a first material such as silicon may be deposited or formed, and then the layer may be treated with, e.g., oxygen in order to form the final material for the insert layer 18. Any suitable process may be used to form the insert layer 18. The insert layer 18 may be formed to a second thickness T2 of in a range from about 10 Å to about 100 Å, such as about 50 Å.

Figure 3:
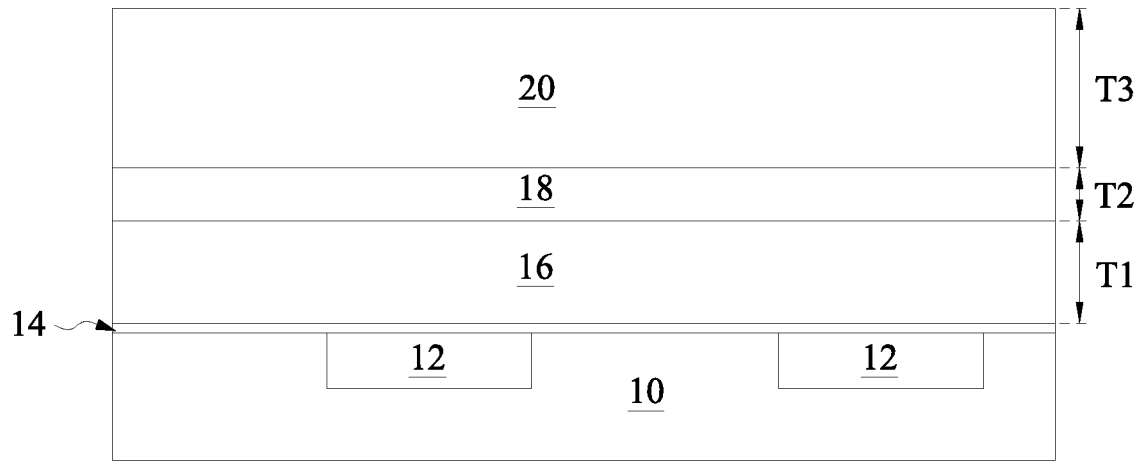

FIG. 3 illustrates forming a second dielectric layer 20 over the insert layer 18. In an embodiment the second dielectric layer 20 may be formed from a similar material and in a similar fashion as the first dielectric layer 16. For example, the second dielectric layer 20 may comprise a porous material such as ATRP (1-Isopropyl-4-Methyl-1, 3-Cyclohexadiene) or Cyclooctane (boat shape) or 1, 2-bis(triethoxysilyl) ethane Silicon formed by initially placing a matrix material and a porogen and then removing the porogen. However, in other embodiments the second dielectric layer 20 may be a different material than the first dielectric layer 16. Any suitable combination of materials may be formed. In an embodiment the second dielectric layer 20 may be formed to a third thickness T3 of in a range from about 10 Å to about 1000 Å, such as about 600 Å.

Figure 4:
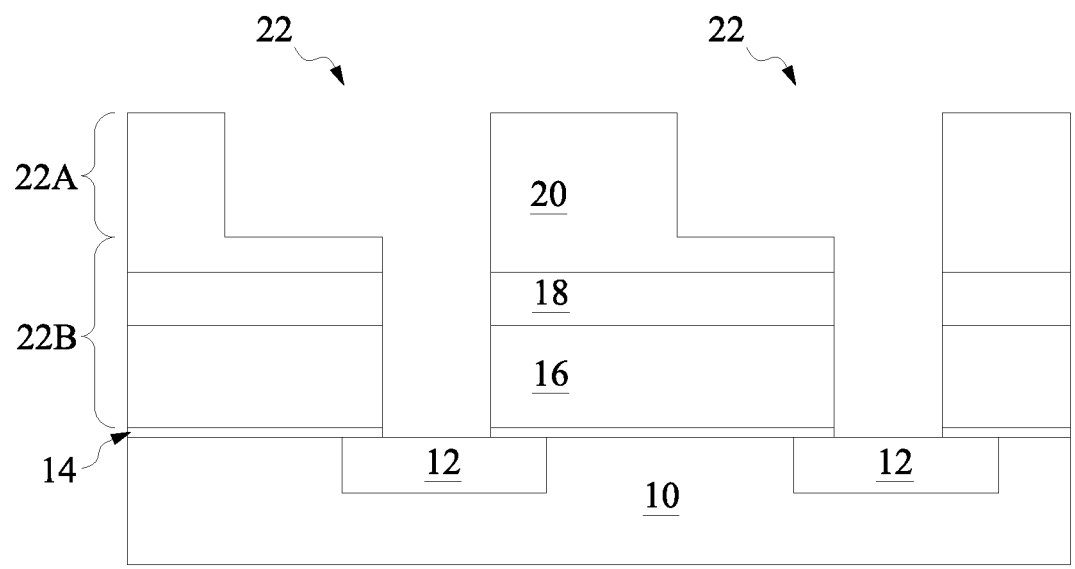

FIG. 4 illustrates patterning the second dielectric layer 20, the insert layer 18, the first dielectric layer 16, and the etch stop layer 14, if present, to form openings 22 to expose portions of the conductive elements 12. The openings 22 allows a portion of the interconnects 24 to make physical and electrical contact with the conductive elements 12. In some embodiments, the openings 22 are dual damascene openings including upper trench sections 22A and lower via-hole sections 22B. Although the embodiments illustrate dual damascene openings in the layers 16, 18, and 20, the method disclosed in the present application is applicable for an embodiment having single damascene openings in the layers. In dual damascene techniques including a "via-first" patterning method or a "trench-first" patterning method, the upper trench section 22A and the lower via-hole section 22B may be formed using photolithography with masking technologies and anisotropic etch operations (e.g. plasma etching or reactive ion etching).

For example, in a via-first embodiment, a first photoresist (not shown) is formed over the second dielectric layer 20 and patterned to expose a portion of the second dielectric layer 20. The first photoresist can be formed by using a spin-on technique and can be patterned using acceptable photolithography techniques. Once the first photoresist is patterned, a first anisotropic etching process is performed to form the via openings to the conductive elements 12, and the first photoresist may act as a mask for the etching process. After the first anisotropic etching process, the first photoresist is removed, such as by an acceptable ashing process. After the first photoresist is removed, a second photoresist is formed over the second dielectric layer 20 and patterned to expose a portion of the second dielectric layer 20. The second photoresist can be formed by using a spin-on technique and can be patterned using acceptable photolithography techniques. Once the second photoresist is patterned, a second anisotropic etching process is performed to form the trench section of the openings, and the second photoresist may act as a mask for the etching process. After the second anisotropic etching process, the second photoresist is removed, such as by an acceptable ashing process.

Whereas previous processes (which do not utilize the insert layer 18) resulted in unbalanced stresses from nearby via etching processes that resulted in a bending of the top opening of trenches adjacent to the via and caused critical dimension mismatch issues in a range from trench openings at different locations around the device, the presence of the insert layer 18 will help to prevent the first dielectric layer 16 and the second dielectric layer 20 from bending or collapsing. As such, the top of the openings 22 will better retain the desired shape, and openings 22 across the device may have less variation. For example, whereas previous processes without the insert layer 18 may result in bending that could cause variations in widths in a range from different openings 22 of in a range from about 5 nm to about 6 nm, such as about 5.5 nm (or greater than 10% of the desired pattern), the inclusion of the insert layer 18 may reduce the amount of bending at the top of the openings 22.

Figure 5:
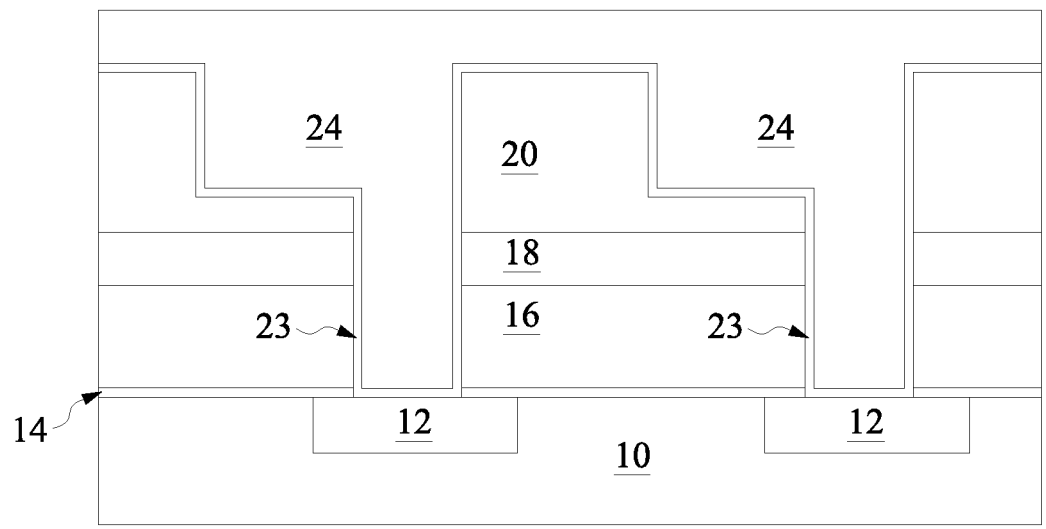

FIG. 5 illustrates a filling of the openings 22 with a conductive material 24. In an embodiment the openings 22 may be filled with a barrier layer 23 and a conductive material 24. The barrier layer 23 may comprise a conductive material such as titanium nitride, although other materials, such as tantalum nitride, titanium, a dielectric, or the like may alternatively be utilized. The barrier layer 23 may be formed using a CVD process, such as PECVD. In some embodiments, the barrier layer 23 is formed to have a thickness in a range from about 10 Å to about 1000 Å. However, other processes, such as sputtering or metal organic chemical vapor deposition (MOCVD), may be used. The barrier layer 23 is formed so as to contour to the underlying shape of the openings 22.

The conductive material 24 may comprise copper, although other suitable materials such as aluminum, alloys, doped polysilicon, combinations thereof, and the like, may alternatively be utilized. The conductive material may be formed by first depositing a seed layer (not separately illustrated in FIG. 5) and then electroplating copper onto the seed layer, filling and overfilling the openings 22.

Figure 6:
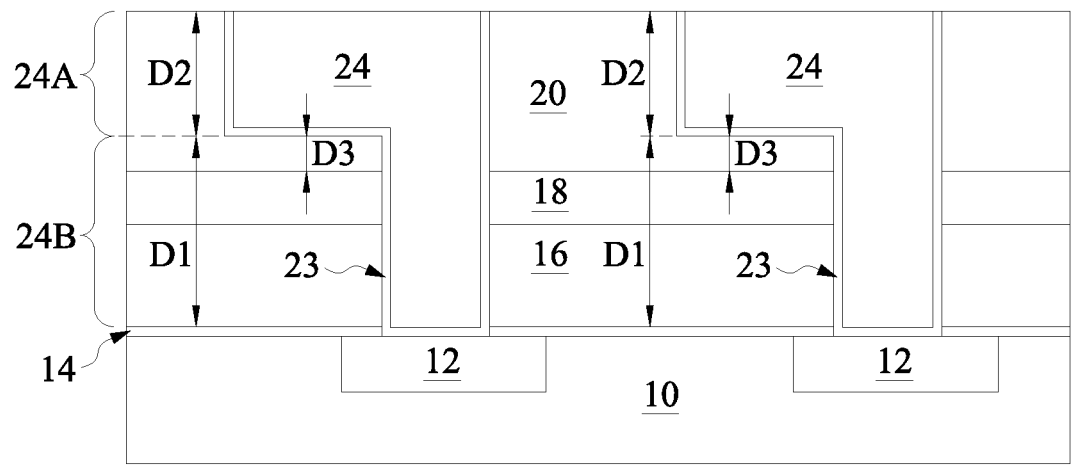

Once the openings 22 have been filled, FIG. 6 illustrates removing excess barrier layer 23 and excess conductive material 24 outside of the openings 22 to form interconnects 24. In some embodiments, the removal of excess barrier layer 23 and excess conductive material 24 is by a grinding process such as chemical mechanical polishing (CMP), although any suitable removal process may be used. In some embodiments, the interconnects 24 are dual damascene interconnects including an trench section 24A and a via section 24B. In some embodiments, the via sections 24B of the interconnects 24 have heights D1 measured from a surface of the substrate 10 with the heights D1 being in a range from about 400 Å to about 450 Å. In some embodiments, the trench sections 24A of the interconnects 24 have heights D2 measured from top surfaces of trench sections 24A to bottom surfaces of the trench sections 24A with the heights D2 being in a range from about 410 Å to about 460 Å. In some embodiments, bottom surfaces of the trench sections 24A of the interconnects 24 are separated from a top surface of the insert layer 18 by a distance D3 with the distance D3 being in a range from about 20 Å to about 130 Å.

By forming the insert layer 18 to provide additional support for the first dielectric layer 16 as well as the second dielectric layer 20, the disfiguration and bending that would normally occur during the patterning process may be mitigated or prevented. As such, the deleterious effects of these undesired disfigurations, such as variable reduced widths along a top of the openings 22, may be prevented. Such preventions allow for fewer defects during the subsequent filling process.

Figure 7:
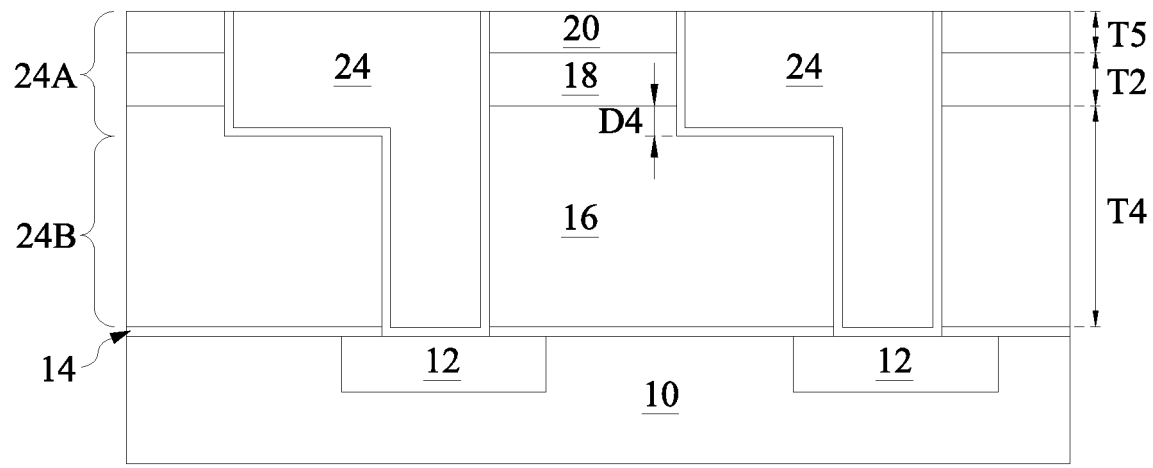
FIG. 7 is a cross-sectional views of an interconnect structure in accordance with some embodiments.

FIG. 7 illustrates a cross-section view of an interconnect structure in accordance with another embodiment. The embodiment in FIG. 7 is similar to the embodiments illustrated in FIGS. 1 through 6 except that in this embodiment the insert layer 18 is formed in the trench section of the interconnects 24 as opposed to the via section in the previous embodiment. The materials and formation processes of the first dielectric layer 16, the insert layer 18, and the second dielectric layer 20 may be similar to the previously described embodiment except that that the relative thicknesses of the layers may be altered, and thus, the description of these layers is not repeated herein. Details regarding this embodiment that are similar to those for the previously described embodiment will not be repeated herein.

In this embodiment the first dielectric layer 16 may have a fourth thickness T4 of in a range from about 10 Å to about 1000 Å, such as about 600 Å, the insert layer 18 may have a second thickness T2, and the second dielectric layer 20 may have a fifth thickness T5 of in a range from about 10 Å to about 1000 Å, such as about 300 Å. In this embodiment, bottom surfaces of the trench sections 24A of the interconnects 24 are separated from a bottom surface of the insert layer 18 by a distance D4 with the distance D4 being in a range from about 30 Å to about 150 Å.

FIGS. 8 through 11 are cross-sectional views of intermediate stages in the manufacturing of an interconnect structure in accordance with another embodiment. This embodiment is similar to the embodiments illustrated in FIGS. 1 through 6 except that in this embodiment the insert layer is formed by a plasma treatment process as opposed to the deposition process in the previous embodiment. Details regarding this embodiment that are similar to those for the previously described embodiment will not be repeated herein.

Figure 8:
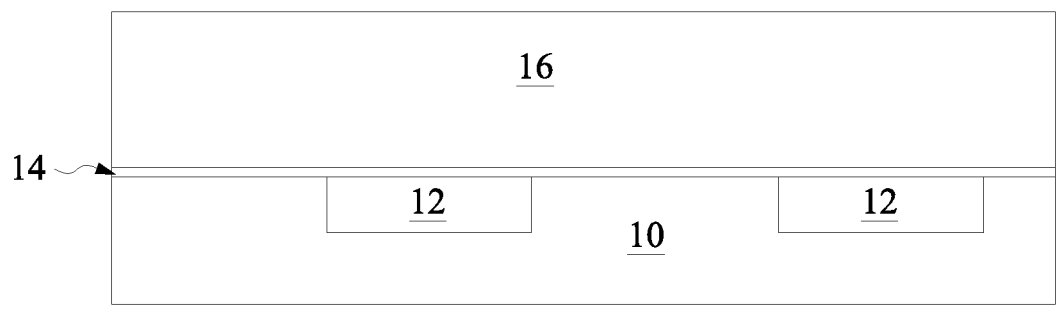
FIGS. 8 through 11 are cross-sectional views of intermediate stages in the manufacturing of an interconnect structure in accordance with some embodiments.

FIG. 8 is at a similar point of processing as FIG. 1 described above and the descriptions of the processes and steps performed up until this point are not repeated herein. FIG. 8 includes the substrate 10, the conductive elements 12, the optional etch stop layer 14, and the first dielectric layer 16.

Figure 9:
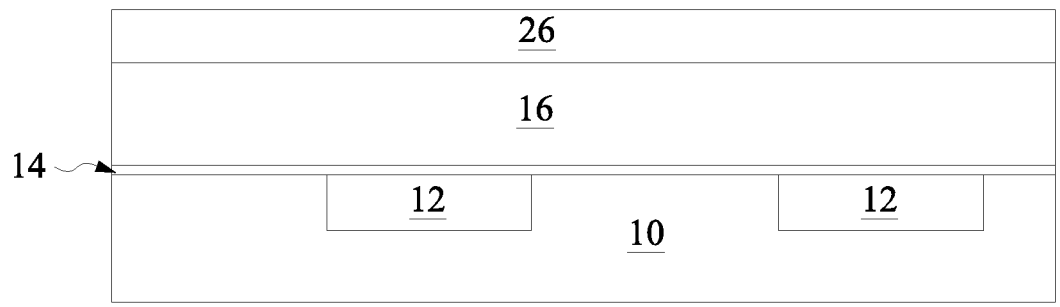

FIG. 9 illustrates the formation of insert layer 26 over the first dielectric layer 16 in order to provide a frame for additional structural support to increase the robustness of the first dielectric layer 16 and other subsequently deposited layers. In addition, the inclusion of the insert layer 26 impacts the capacitance less than simply changing the bulk film from being a low-k dielectric film. In an embodiment the insert layer 26 is a material with a larger hardness and a higher K-value than the first dielectric layer 16. For example, in some embodiments, the first dielectric layer 16 has a K-value of about 2.6 or less and the insert layer 26 has a K-value of greater than 2.8, such as about 3.0.

In some embodiments, the insert layer 26 is formed by performing a plasma treatment process on the first dielectric layer 16. The plasma treatment process may include plasma reaction gases such as He, Ar, $NH_3$, $CO_2$, $N_2$, $O_2$, the like, or a combination thereof. In some embodiments, the plasma treatment process may be performed at a temperature in a range from about 200° C. to about 400° C., at a pressure in a range from about 0.5 torr to about 10 torr, and at a treatment power (sometimes referred to as discharge power and/or bombardment intensity) in a range from about 100 Watts (W) to about 500 W. In some embodiments, the plasma system is a direct plasma system, and in other embodiments, the plasma system is a remote plasma system. The plasma treatment process may convert at least an upper portion of the first dielectric layer 16 into the insert layer 26 such that the thickness of the first dielectric layer 16 is reduced. In some embodiments, the insert layer 26 is at least partially formed from the plasma treated first dielectric layer 16, while, in other embodiments, the insert layer 26 consists primarily of plasma treated first dielectric layer 16.

Figure 10:
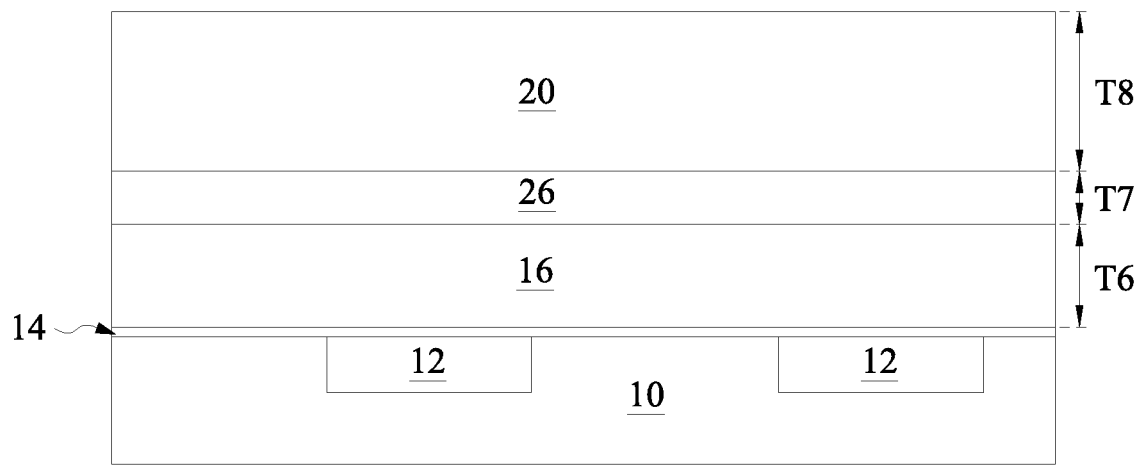

FIG. 10 illustrates forming the second dielectric layer 20 over the insert layer 26. In an embodiment the second dielectric layer 20 may be formed from a similar material and in a similar fashion as the first dielectric layer 16. However, in other embodiments the second dielectric layer 20 may be a different material than the first dielectric layer 16. Any suitable combination of materials may be formed. In an embodiment the second dielectric layer 20 may be formed to a thickness T8 of in a range from about 10 Å to about 1000 Å, such as about 600 Å. The insert layer 26 may be formed to a thickness T7 of in a range from about 10 Å to about 100 Å, such as about 50 Å. The first dielectric layer 16 may be formed to a thickness T6 of in a range from about 10 Å to about 1000 Å, such as about 300 Å.

Figure 11:
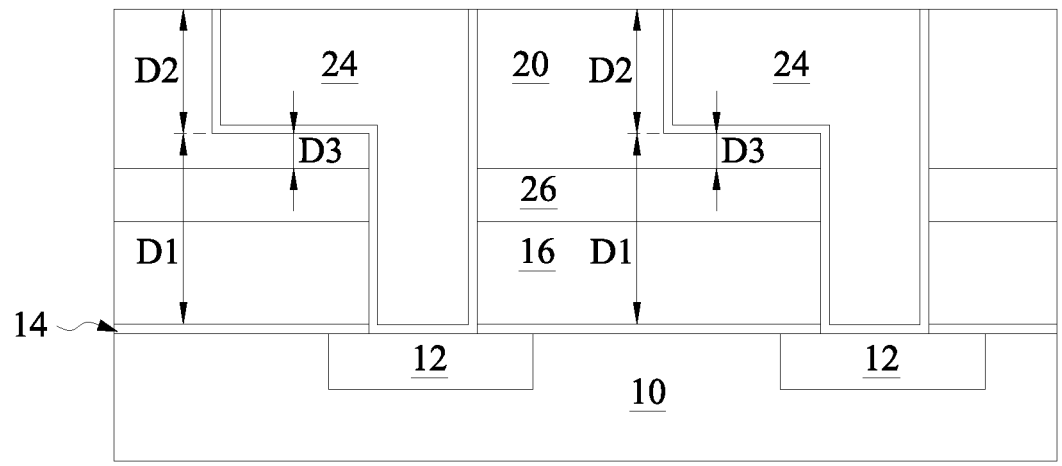

After the second dielectric layer 20 is formed, processing similar to those described above in FIGS. 4, 5, and 6 are performed to form the structure of FIG. 11, which is at a similar point of processing as FIG. 6. The processes and steps of FIGS. 4, 5, and 6 have been described above and are not repeated herein.

Figure 12:
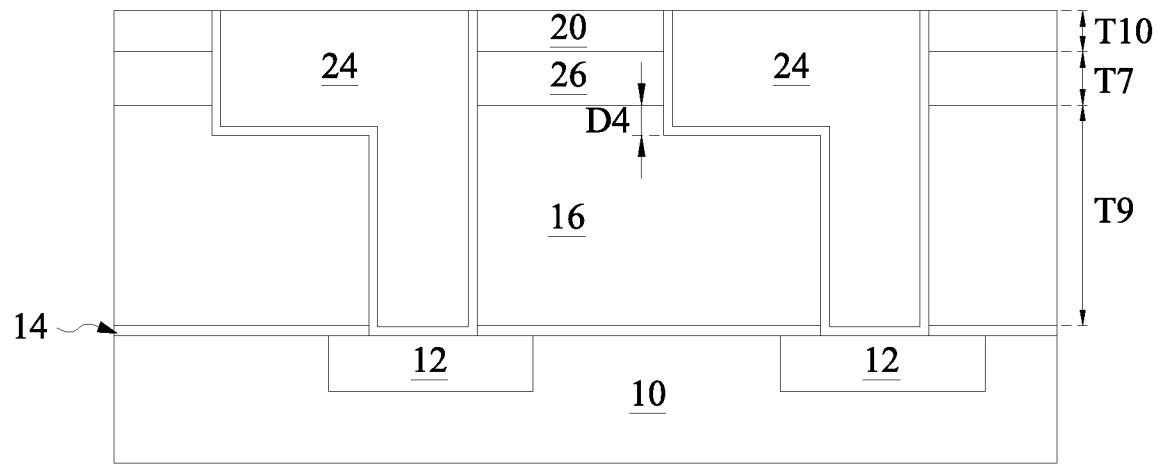
FIG. 12 is a cross-sectional views of an interconnect structure in accordance with some embodiments

FIG. 12 is a cross-sectional views of an interconnect structure in accordance with another embodiment. The embodiment in FIG. 12 is similar to the embodiment illustrated in FIGS. 8 through 11 except that in this embodiment the insert layer 26 is formed in the trench section of the interconnects 24 as opposed to the via section in the previous embodiment. The materials and formation processes of the first dielectric layer 16, the insert layer 26, and the second dielectric layer 20 may be similar to the previously described embodiment except that that the relative thicknesses of the layers may be altered, and thus, the description of these layers is not repeated herein. Details regarding this embodiment that are similar to those for the previously described embodiment will not be repeated herein.

In this embodiment the first dielectric layer 16 may have a thickness T9 in a range from about 10 Å to about 1000 Å, such as about 600 Å, the insert layer 26 may thickness T7, and the second dielectric layer 20 may have a thickness T10 in a range from about 10 Å to about 1000 Å, such as about 300 Å. In this embodiment, bottom surfaces of the trench sections 24A of the interconnects 24 are separated from a bottom surface of the insert layer 26 by the distance D4.

By providing the insert layer as a frame for additional structural support, the normally weaker porous material of the first dielectric layer 16 and second dielectric layer 20 may be supported. Such additional support helps to reduce variances between different openings that may be caused by their proximity (or lack of proximity) to neighboring openings. This prevents complications that could arise during subsequent gap-filling processes.

FIGS. 14 through 18, 19A-19C, 20A-20C, 21A-21C, 22A-22C, 23A-23C, 24A-24C, 25A-25C, 26A-26C, and 27A-27C are cross-sectional views of intermediate stages in the manufacturing of FinFETs with interconnect structures in accordance with some embodiments.

Figure 13:
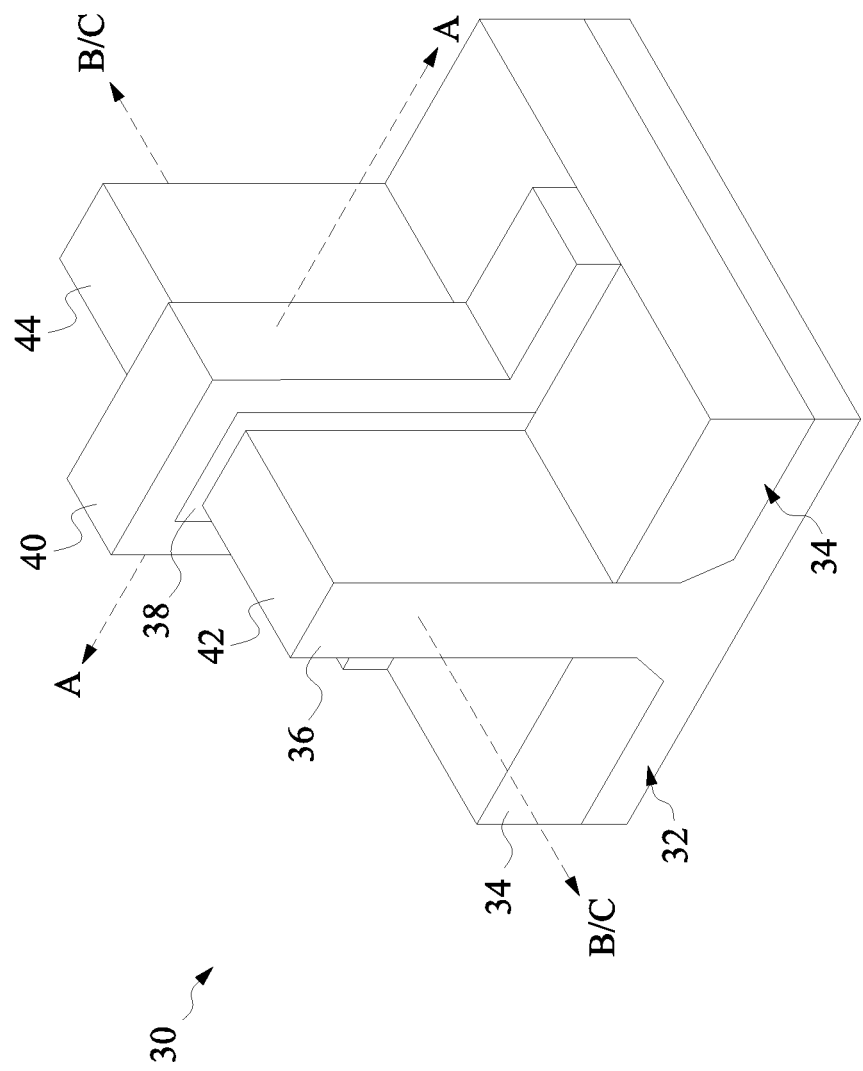
FIG. 13 is an example of a Fin Field-Effect Transistor (FinFET) in a three-dimensional view.

FIG. 13 illustrates an example of a fin field-effect transistor (FinFET) 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 13 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 14 through 27C are cross-sectional views of intermediate stages in the manufacturing of FinFETs in accordance with an exemplary embodiment. FIGS. 14 through 18 illustrate reference cross-section A-A illustrated in FIG. 13, except for multiple FinFETs. In FIGS. 19A through 27C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 14:
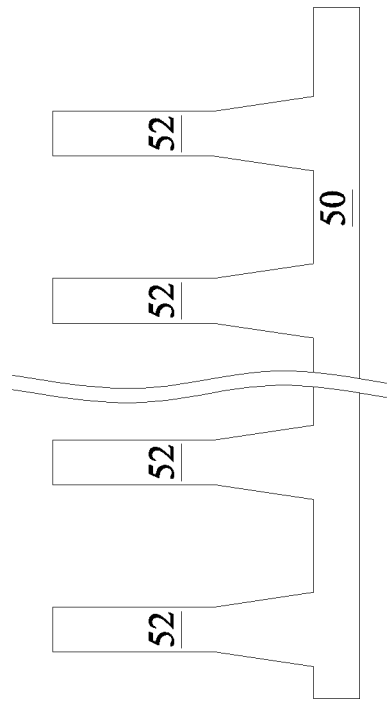
FIGS. 14 through 18, 19A-19C, 20A-20C, 21A-21C, 22A-22C, 23A-23C, 24A-24C, 25A-25C, 26A-26C, and 27A-27C are cross-sectional views of intermediate stages in the manufacturing of FinFETs with interconnect structures in accordance with some embodiments.

FIG. 14 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 15:
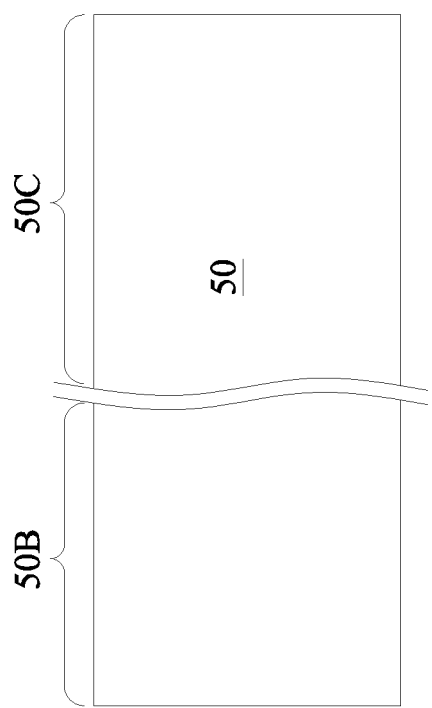
Figure 16:
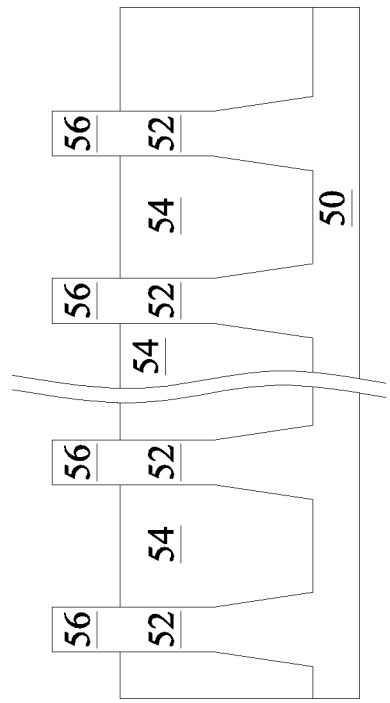

FIGS. 15 and 16 illustrate the formation of fins 52 and isolation regions 54 between neighboring fins 52. In FIG. 15 fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 16 an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, the insulation material 54 is silicon oxide formed by a FCVD process. The insulating material 54 may be referred to as isolation regions 54. Further in FIG. 5 and in step 204, a planarization process, such as a chemical mechanical polish (CMP), may remove any excess insulation material 54 and form top surfaces of the isolation regions 54 and top surfaces of the fins 52 that are coplanar.

Figure 17:
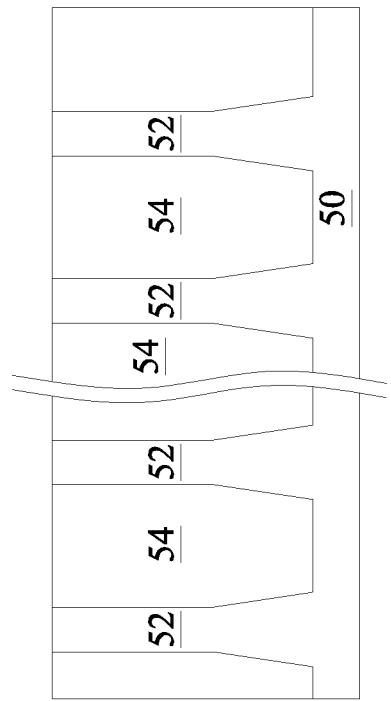

FIG. 17 illustrates the recessing of the isolation regions 54 to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS.

15 through 17 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 16 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 17, appropriate wells may be formed in the fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 18:
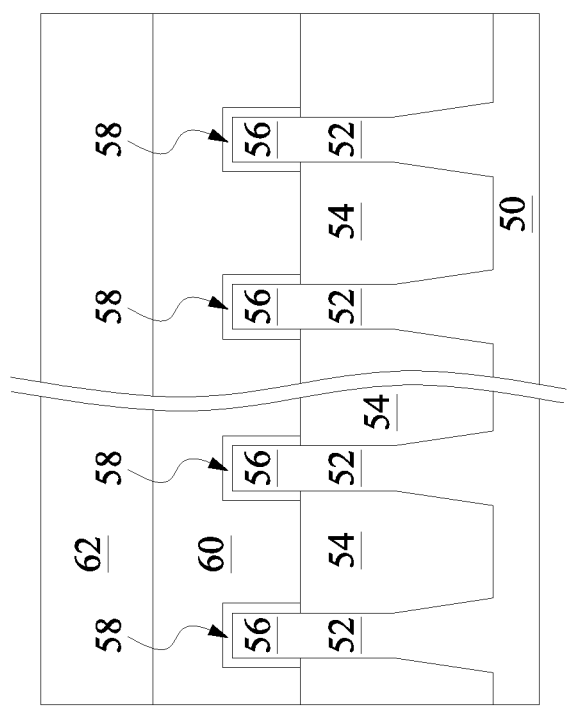

In FIG. 18, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 19B:
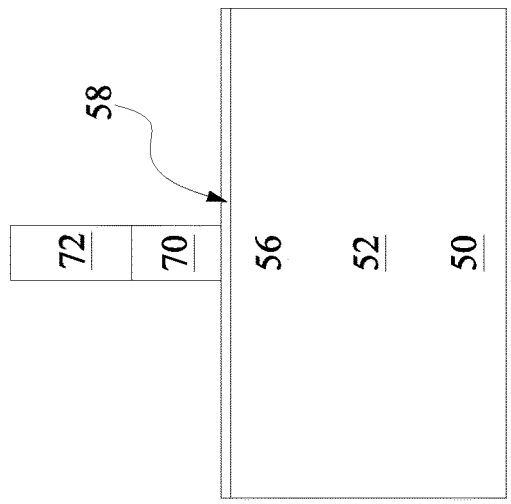
Figure 19C:
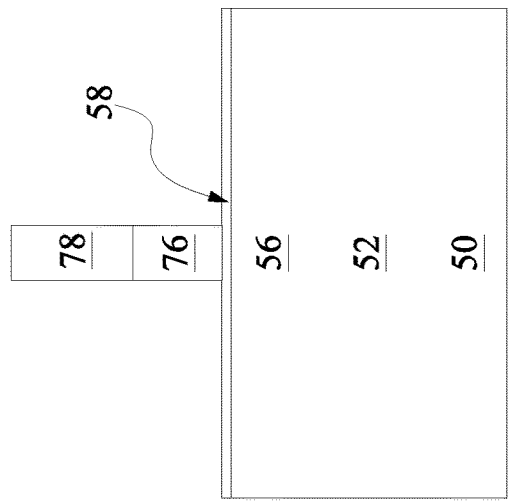
Figure 19A:
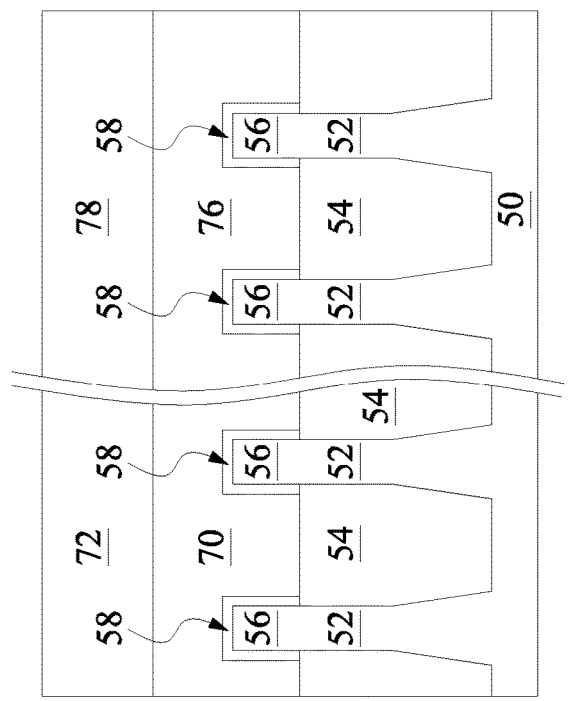

In FIGS. 19A, 19B, and 29C, the mask layer 62 may be patterned using acceptable photolithography and etching techniques to form masks 72 in the first region 50B (as illustrated in FIG. 19B) and masks 78 in the second region 50C (as illustrated in FIG. 19C). The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 20B:
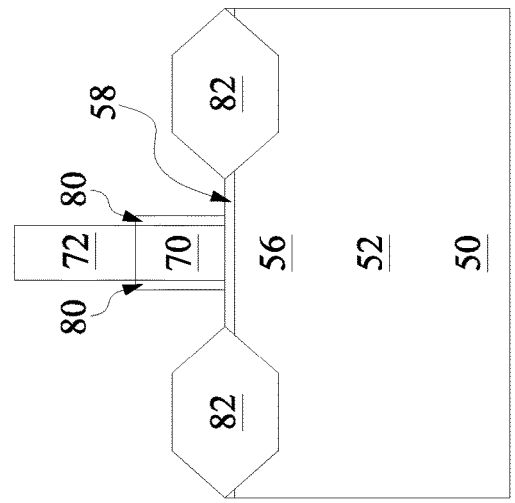
Figure 20C:
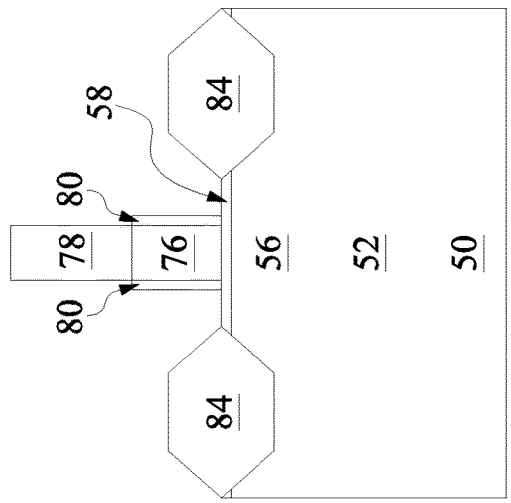
Figure 20A:
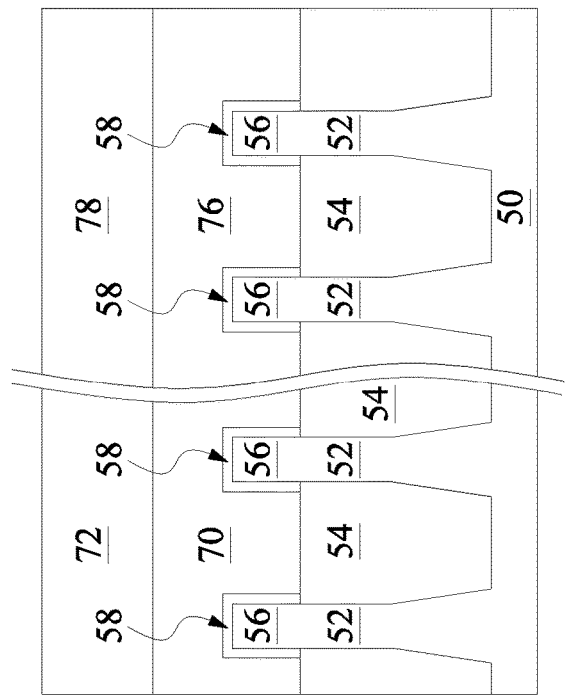

In FIGS. 20A, 20B, and 20C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 17, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 20A, 20B, and 20C, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 21B:
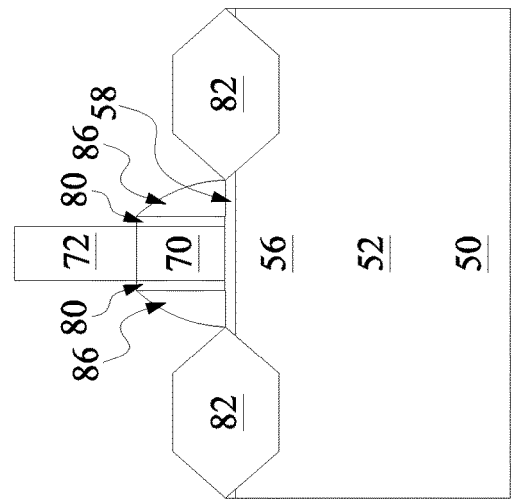
Figure 21C:
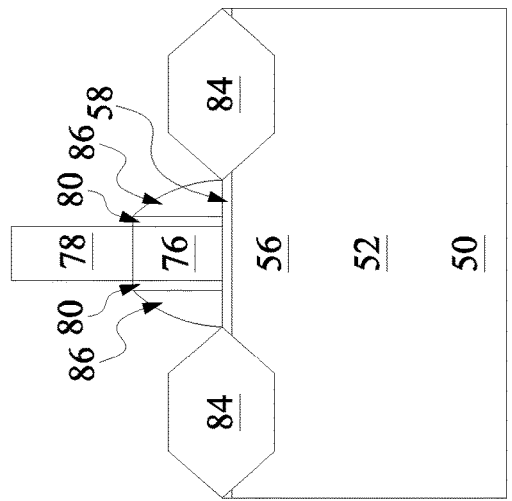
Figure 21A:
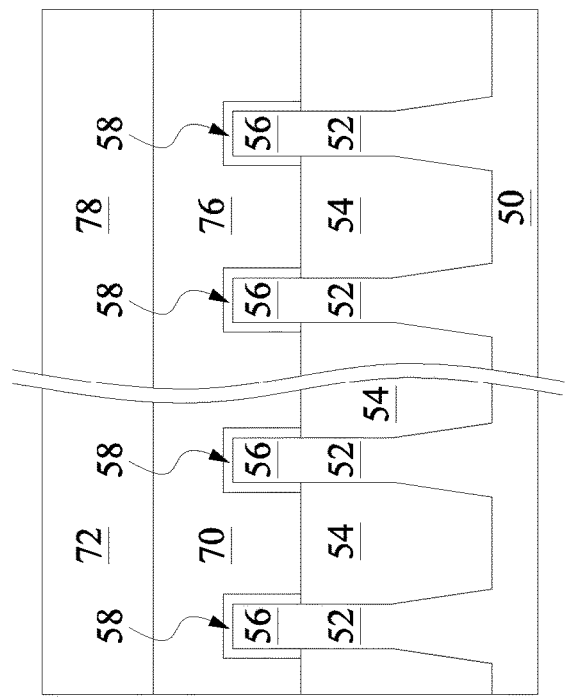

In FIGS. 21A, 21B, and 21C, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 22A:
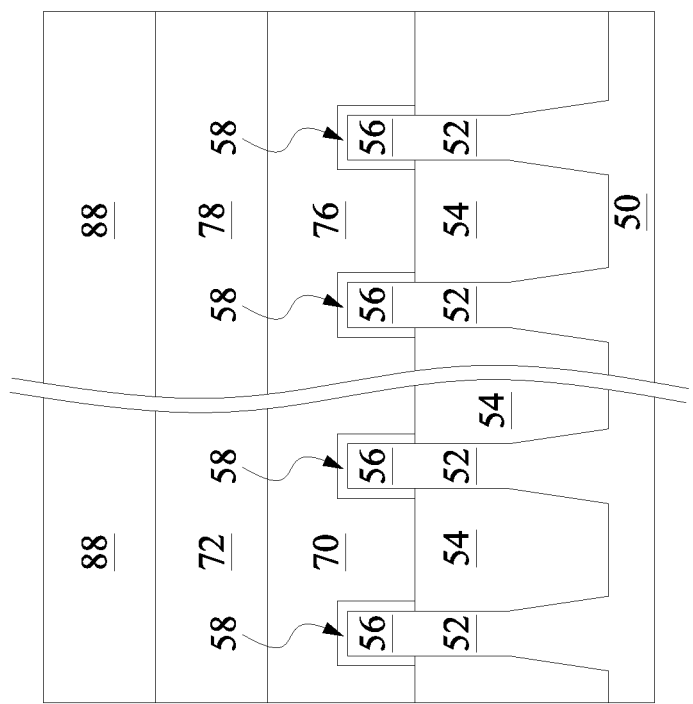
Figure 22C:
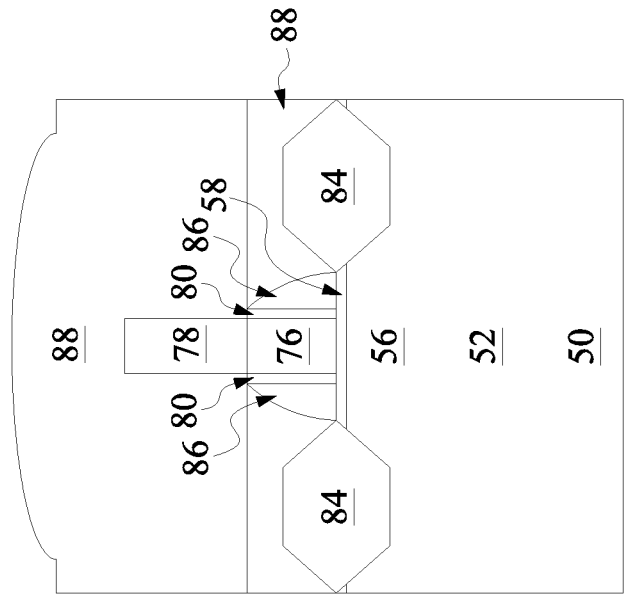
Figure 22B:
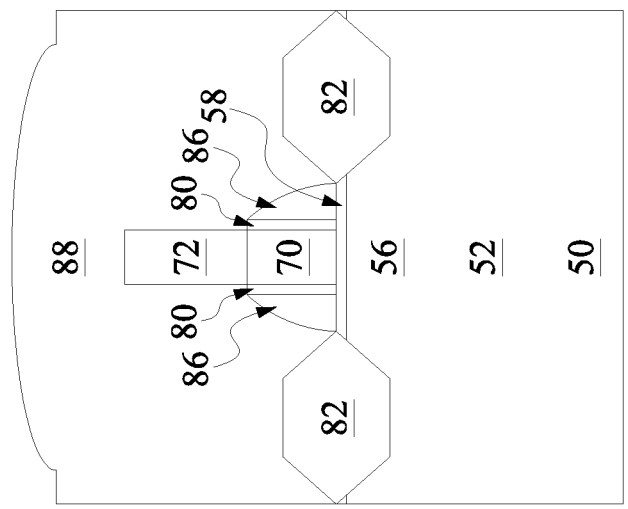

In FIGS. 22A, 22B, and 22C, an ILD 88 is deposited over the structure illustrated in FIGS. 21A, 21B, and 21C. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 23B:
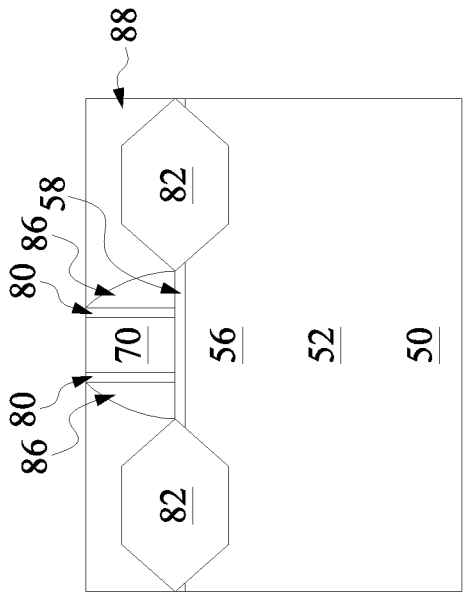
Figure 23C:
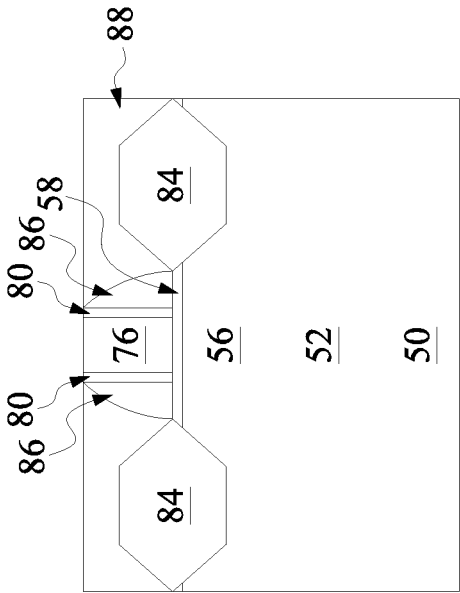
Figure 23A:
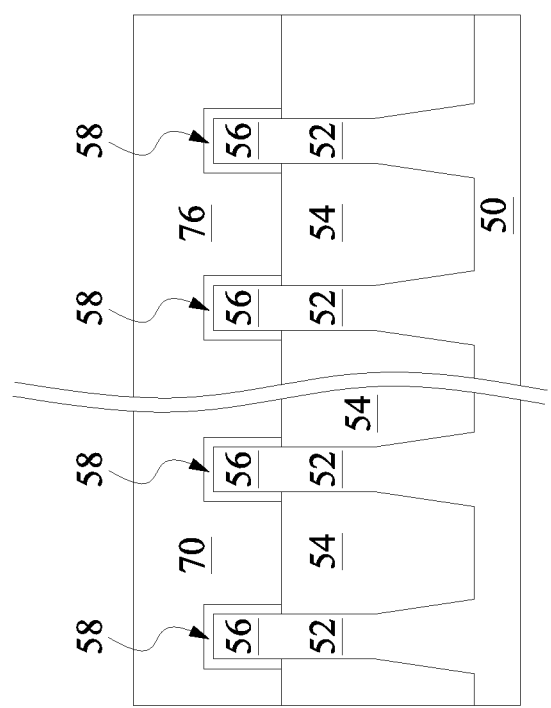

In FIGS. 23A, 23B, and 23C, a planarization process, such as a CMP, may be performed to level the top surface of ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88.

Figure 24B:
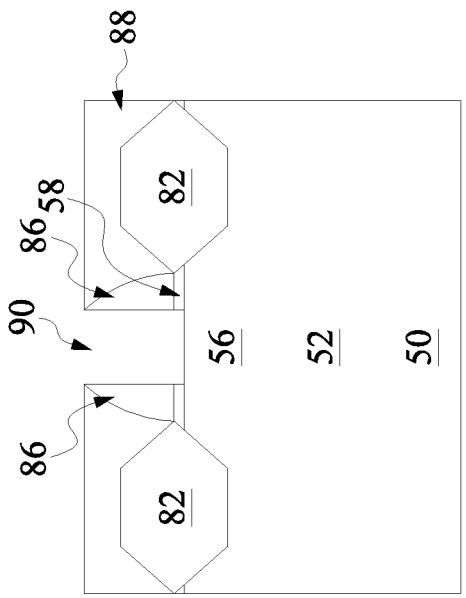
Figure 24C:
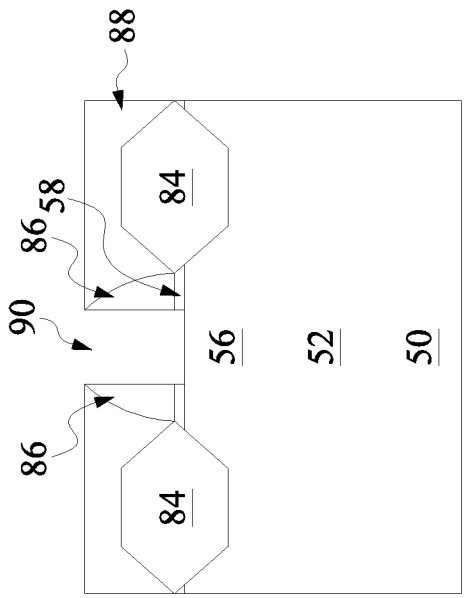
Figure 24A:
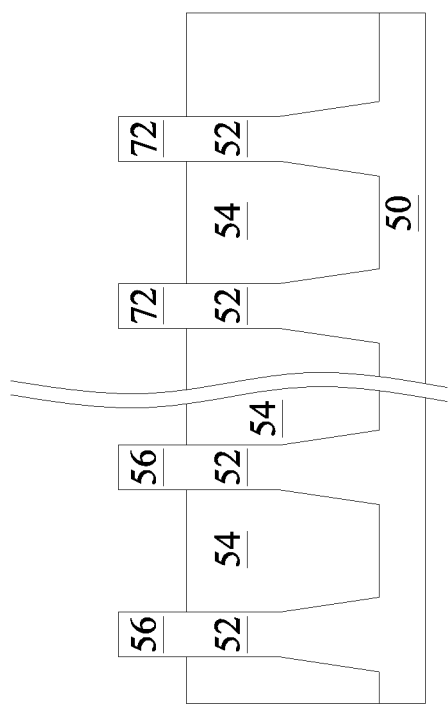

In FIGS. 24A, 24B, and 24C, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

Figure 25B:
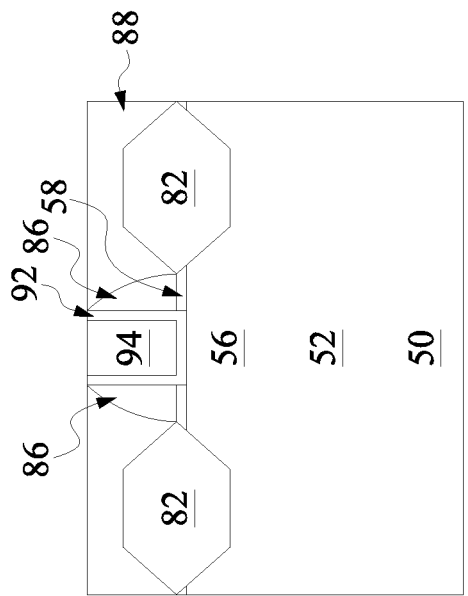
Figure 25C:
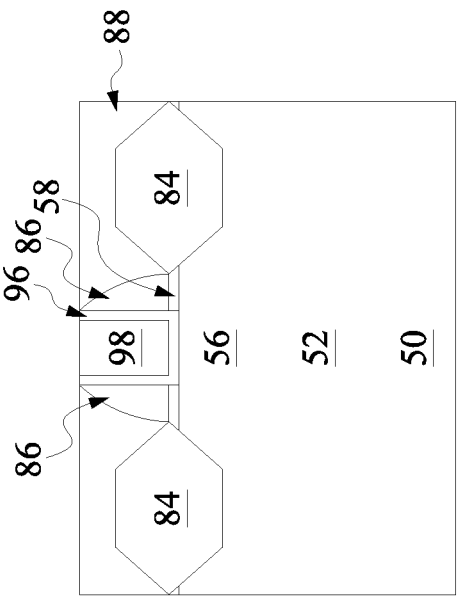
Figure 25A:
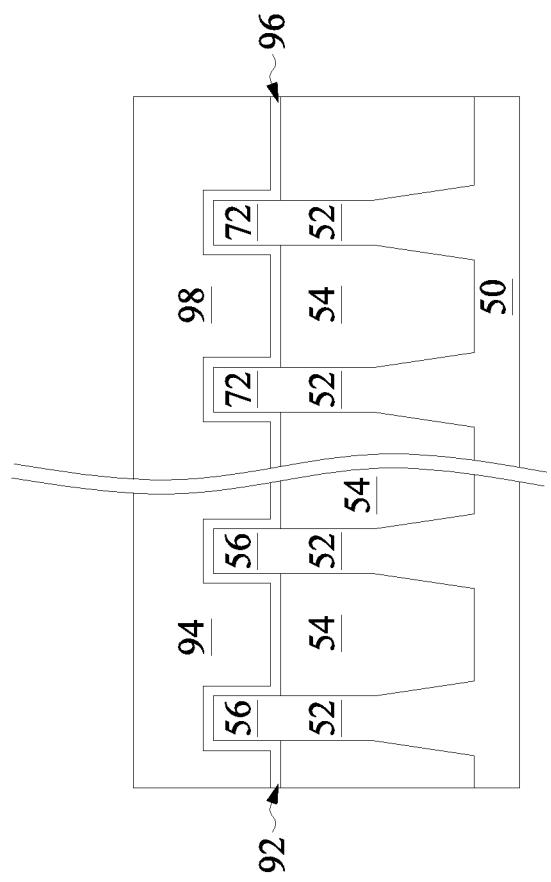

In FIGS. 25A, 25B, and 25C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting FinFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 26B:
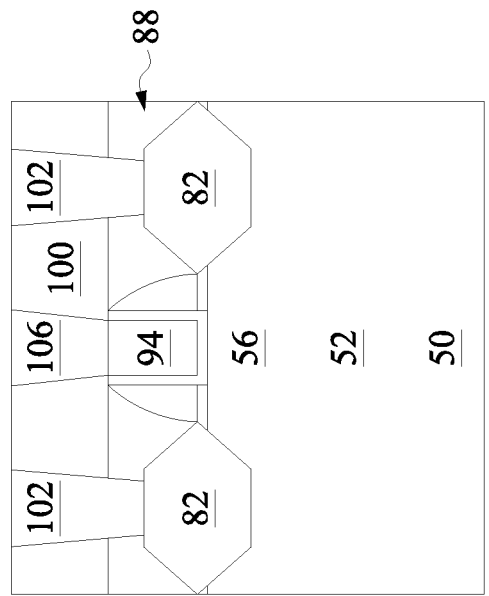
Figure 26C:
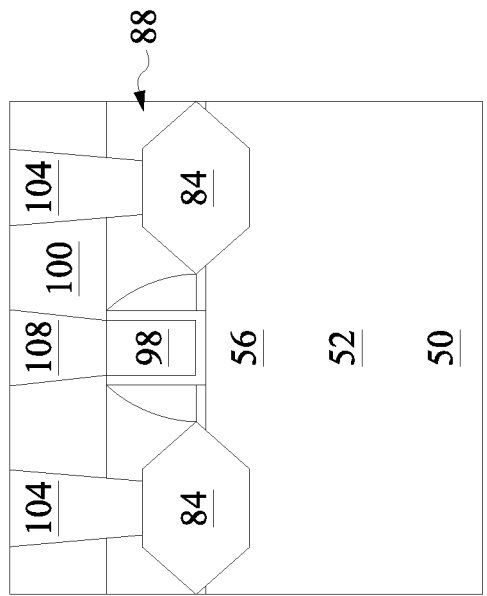
Figure 26A:
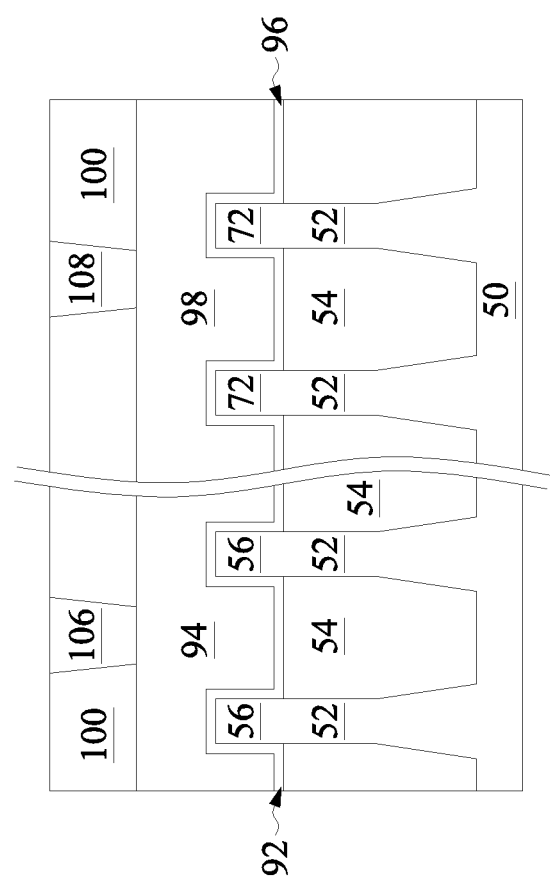

In FIGS. 26A, 26B, and 26C, an ILD 100 is deposited over ILD 88. Further illustrated in FIGS. 26A, 26B, and 26C, contacts 102 and 104 are formed through ILD 100 and ILD 88 and contacts 106 and 108 are formed through ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. Openings for contacts 106 and 108 are formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to the gate electrode 94, and contact 108 is physically and electrically coupled to the gate electrode 98.

Figure 27A:
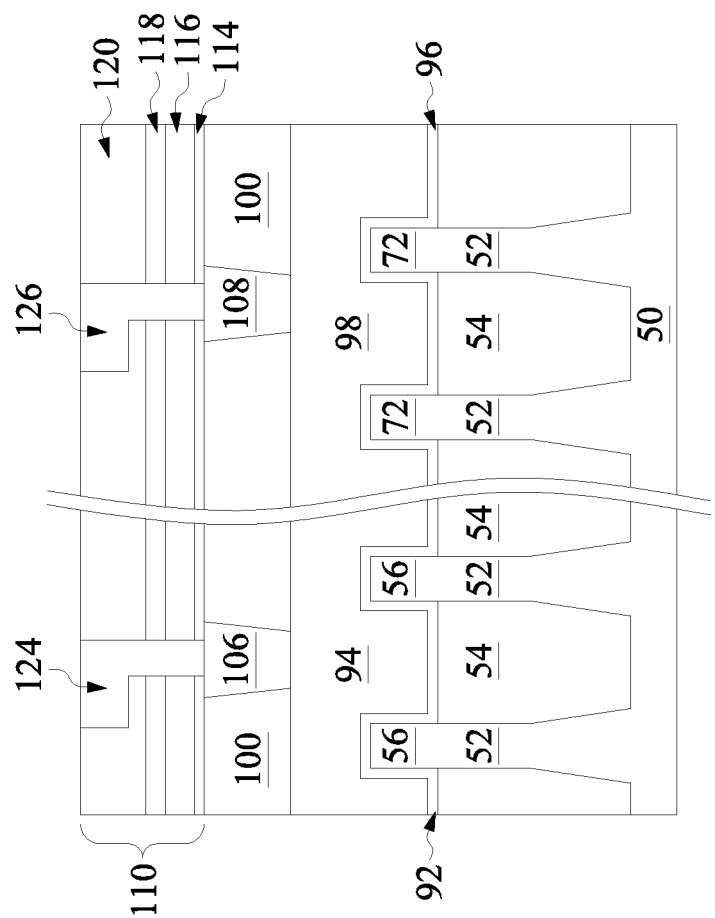
Figure 27C:
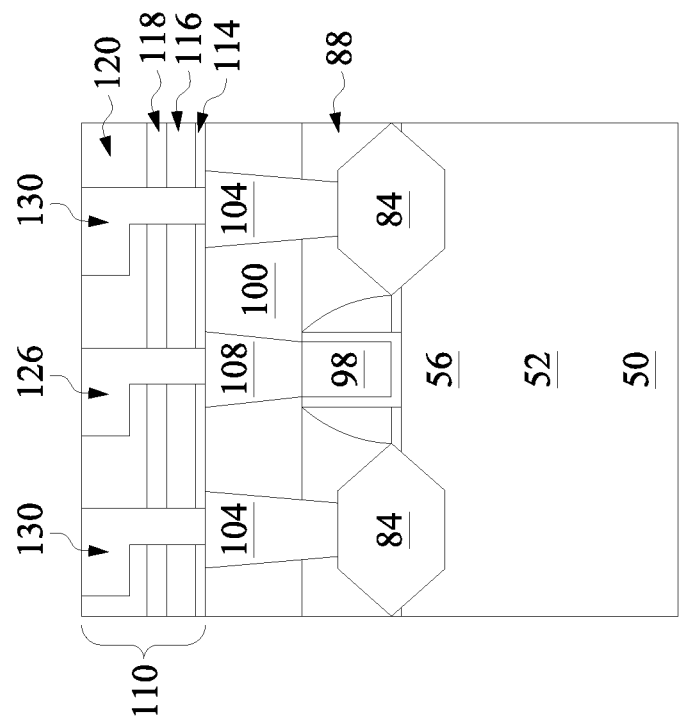
Figure 27B:
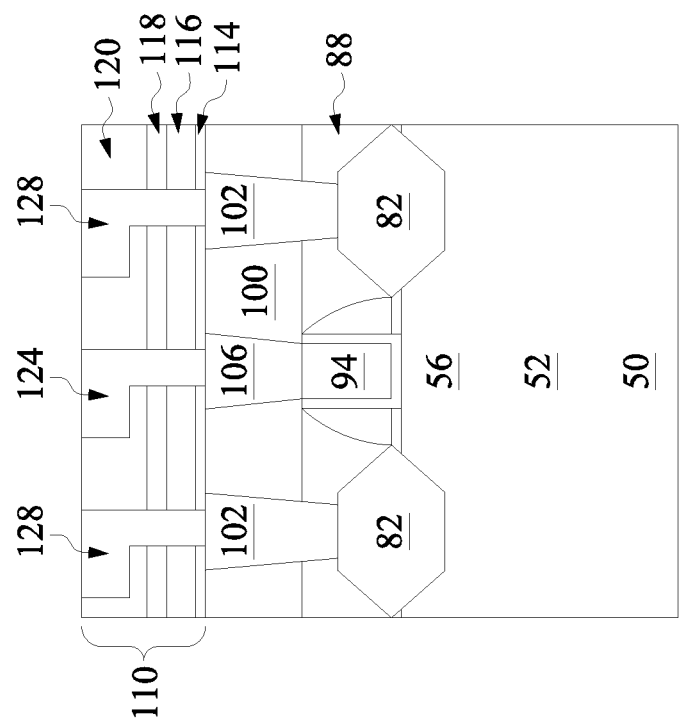

In FIGS. 27A, 27B, and 27C, an Inter-Metal Dielectrics (IMD) 110 is deposited over ILD 100. Further illustrated in FIGS. 27A, 27B, and 27C, interconnects 124, 126, 128, and 130 formed through IMD 110 to contact respective conductive features within the underlying ILD 100 (e.g., contacts 102, 104, 106, and/or 108). In an embodiment, the IMD 110 is a multi-layer film stack formed by the method described above in FIGS. 1-7 and/or FIGS. 8-12 and corresponding paragraphs. Layer 114 corresponds to etch stop layer 14 described above, layer 116 corresponds to first dielectric layer 16 described above, layer 118 corresponds to insert layers 18 or 26 described above, and layer 120 corresponds to second dielectric layer 20 described above. These layers are similar to the corresponding layers described above in previous embodiments and the descriptions are not repeated herein. Openings for the interconnects 124, 126, 128, and 130 are formed through IMD 110 in similar method as described above in FIG. 4 and corresponding paragraphs. These openings may all be formed simultaneously in a same process, or in separate processes. The interconnects 124, 126, 128, and 130 are formed in similar method as described above in FIGS. 5-6 and/or FIGS. 11-12 and corresponding paragraphs. Interconnect 124 is physically and electrically coupled to contact 106, interconnect 126 is physically and electrically coupled to the contact 108, interconnects 128 are physically and electrically coupled to the contacts 102, and interconnects 130 are physically and electrically coupled to the contacts 104.

Although not explicitly shown, a person having ordinary skill in the art will readily understand that further processing steps may be performed on the structure in FIGS. 27A, 27B, and 27C. For example, various IMDs and their corresponding metallizations may be formed over IMD 110.

By providing the insert layer (e.g. layers 18, 26, and/or 118), as a frame for additional structural support, the normally weaker porous material of the surrounding dielectric layers (e.g. layers 16, 20, 116, and/or 120), may be supported. Such additional support helps to reduce variances between different openings that may be caused by their proximity (or lack of proximity) to neighboring openings. This prevents complications that could arise during subsequent gap-filling processes.

An embodiment is a method including depositing a first dielectric layer over a substrate, forming a second dielectric layer on the first dielectric layer, the second dielectric layer having a hardness that is greater than the first dielectric layer and a K-value that is greater than the first dielectric layer, and depositing a third dielectric layer over the second dielectric layer, the third dielectric layer having a hardness that is less than the second dielectric layer and a K-value that is less than the second dielectric layer. The method further includes etching the third dielectric layer, the second dielectric layer, and the first dielectric layer to form a first opening exposing a first region over the substrate, the first opening having a via opening of a first width and a trench opening of a second width, the trench opening overlapping the via opening, the second width being greater than the first width, a bottom surface of the trench opening being separated from a surface of the second dielectric layer by a first portion of the first dielectric layer or a first portion of the third dielectric layer, and filling the first opening with a conductive material to form a first conductive interconnect contacting the first region of the substrate, the first conductive interconnect comprising a via portion in the via opening and a trench portion in the trench opening.

Another embodiment is a method including depositing a first dielectric layer having a first thickness over a conductive element over a substrate, performing a plasma treatment process to form an insert layer on the first dielectric layer, the insert layer having a K-value that is greater than the first dielectric layer, wherein after the plasma treatment process, the first dielectric layer has a second thickness less than the first thickness, and depositing a second dielectric layer over the insert layer, the second dielectric layer having a K-value that is less than the insert layer. The method further includes etching the second dielectric layer, the insert layer, and the first dielectric layer to form a via opening exposing the conductive element over the substrate, and etching the second dielectric layer to form a trench opening overlapping the via opening, the trench opening having a greater width than the via opening, a first portion of the second dielectric layer being interposed between a bottom surface of the trench opening and a top surface of the insert layer.

A further embodiment is a structure including a first dielectric layer over a substrate, an insert layer over and in contact with the first dielectric layer, the insert layer having a hardness that is greater than the first dielectric layer and a K-value that is greater than the first dielectric layer, a second dielectric layer over and in contact with the insert layer, the second dielectric layer having a hardness that is less than the insert layer and a K-value that is less than the insert layer, and a first conductive interconnect extending through the second dielectric layer, the insert layer, and the first dielectric layer to contact a first region over the substrate, the first conductive interconnect comprising via portion of a first width and a trench portion of a second width, the trench portion overlapping the via portion, the second width being greater than the first width, a bottom surface of the trench portion being separated from a surface of the insert layer by a first portion of the first dielectric layer or a first portion of the second dielectric layer.

In some embodiments, a structure includes a first dielectric layer over a substrate, an insert layer over and in contact with the first dielectric layer, the insert layer having a hardness that is greater than the first dielectric layer and a K-value that is greater than the first dielectric layer, and a second dielectric layer over and in contact with the insert layer, the second dielectric layer having a hardness that is less than the insert layer and a K-value that is less than the insert layer. The structure further includes a first conductive interconnect extending through the second dielectric layer, the insert layer, and the first dielectric layer to contact a first region over the substrate, the first conductive interconnect comprising a via portion of a first width and a trench portion of a second width, the trench portion overlapping the via portion, the second width being greater than the first width, a bottom surface of the trench portion being separated from a surface of the insert layer by a first portion of the first dielectric layer or a first portion of the second dielectric layer.

In some embodiments, a structure includes a first dielectric layer over a substrate, the first dielectric layer having a first hardness, a second dielectric layer over the first dielectric layer, where the second dielectric layer has a second hardness larger than the first hardness, and a third dielectric layer over the second dielectric layer, where the third dielectric layer has a third hardness smaller than the second hardness. The structure further includes an interconnect structure extending through the first dielectric layer, the second dielectric layer, and the third dielectric layer, where the interconnect structure has a via portion with a first width and a trench portion with a second width, where the trench portion overlaps with the via portion, and the second width is larger than the first width.

In some embodiments, a structure includes a fin protruding above a substrate, a gate structure over the fin, an interlayer dielectric over the gate structure, and a gate contact in the interlayer dielectric, the gate contact being electrically coupled to the gate structure. The structure also includes a first dielectric layer over the interlayer dielectric, a second dielectric layer over the first dielectric layer, the second dielectric layer having a second hardness that is larger than a first hardness of the first dielectric layer, and a third dielectric layer over the second dielectric layer, the third dielectric layer having a third hardness smaller than the second hardness. The structure further includes a conductive interconnect in the first dielectric layer, the second dielectric layer, and the third dielectric layer, the conductive interconnect being electrically coupled to the gate contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric layer over a substrate;
    forming a second dielectric layer over the first dielectric layer, wherein a second hardness of the second dielectric layer is greater than a first hardness of the first dielectric layer;
    forming a third dielectric layer over the second dielectric layer, wherein a third hardness of the third dielectric layer is less than the second hardness of the second dielectric layer; and
    forming a conductive interconnect extending through the third dielectric layer, the second dielectric layer, and the first dielectric layer to contact a conductive region over the substrate, wherein the conductive interconnect comprises a trench portion and a via portion between the trench portion and the conductive region, wherein the trench portion is wider than the via portion, and a bottom surface of the trench portion facing the substrate is spaced apart from the second dielectric layer.

2. The method of claim 1, wherein the bottom surface of the trench portion is formed in the third dielectric layer.

3. The method of claim 1, wherein the bottom surface of the trench portion is formed in the first dielectric layer.

4. The method of claim 1, wherein forming the conductive interconnect comprises:
    etching the third dielectric layer, the second dielectric layer, and the first dielectric layer to form a first opening exposing the conductive region over the substrate, the first opening having a via opening and a trench opening wider than the via opening, wherein a bottom surface of the trench opening is in the first dielectric layer or in the third dielectric layer with a first portion of the third dielectric layer disposed between the bottom surface of the trench opening and the second dielectric layer; and
    filling the first opening with a conductive material, the conductive material in the via opening forming the via portion, and the conductive material in the trench opening forming the trench portion.

5. The method of claim 1, wherein the conductive region over the substrate is a conductive contact electrically connected to a source/drain region of a transistor.

6. The method of claim 1, wherein the second dielectric layer contacts the via portion of the conductive interconnect.

7. The method of claim 1, wherein the second dielectric layer contacts the trench portion of the conductive interconnect.

8. The method of claim 1, wherein the first dielectric layer has a first K-value that is smaller than a second K-value of the second dielectric layer, and the third dielectric layer has a third K-value that is smaller than the second K-value of the second dielectric layer.

9. The method of claim 8, wherein the first K-value is in a range between about 2.3 and about 2.9, and the second K-value is larger than about 3.0.

10. The method of claim 1, wherein the first hardness of the first dielectric layer is in a range between about 1.5 GPa and about 3.0 GPa, and the second hardness of the second dielectric layer is between about 10 GPa to about 13 GPa.

11. The method of claim 1, wherein the first dielectric layer and the third dielectric layer are formed of a same material.

12. The method of claim 1, wherein forming the second dielectric layer comprises converting an upper portion of the first dielectric layer into the second dielectric layer using a plasma process.

13. The method of claim 12, wherein the plasma process is performed using a gas source comprising He, Ar, $NH_3$, $CO_2$, $N_2$, $O_2$, or combinations thereof.

14. A method comprising:
forming a first dielectric layer over a conductive element in a substrate;
forming a second dielectric layer over the first dielectric layer;
forming a third dielectric layer over the second dielectric layer, wherein the second dielectric layer has a second hardness greater than a first hardness of the first dielectric layer, and the third dielectric layer has a third hardness smaller than the second hardness; and
forming a conductive interconnect that extends through the third dielectric layer, the second dielectric layer and the first dielectric layer to electrically couple to the conductive element in the substrate, wherein the conductive interconnect has a via portion and a trench portion that is over the via portion and wider than the via portion, wherein the via portion contacts the conductive element in the substrate, and wherein a bottom of the trench portion connected to the via portion is separated from the second dielectric layer.

15. The method of claim 14, wherein the bottom of the trench portion is separated from the second dielectric layer by a portion of the third dielectric layer.

16. The method of claim 14, wherein forming the conductive interconnect comprises:
etching the third dielectric layer, the second dielectric layer, and the first dielectric layer to form an opening exposing the conductive element, the opening comprising a via opening and a trench opening over the via opening, the trench opening having a greater width than the via opening, a bottom surface of the trench opening facing the substrate being separated from a surface of the second dielectric layer; and
filling the opening with one or more conductive materials.

17. The method of claim 14, wherein the first dielectric layer has a first K-value that is smaller than a second K-value of the second dielectric layer, and the third dielectric layer has a third K-value that is smaller than the second K-value of the second dielectric layer.

18. The method of claim 14, wherein forming the conductive interconnect comprises converting an upper layer of the first dielectric layer into the second dielectric layer by performing a plasma process.

19. A method comprising:
forming a first dielectric layer over a substrate, the first dielectric layer having a first hardness;
forming a second dielectric layer over the first dielectric layer, the second dielectric layer having a second hardness;
forming a third dielectric layer over the second dielectric layer, the third dielectric layer having a third hardness, wherein the second hardness is greater than the first hardness, and the third hardness is smaller than the second hardness; and
forming a conductive interconnect that extends through the third dielectric layer, the second dielectric layer and the first dielectric layer to electrically couple to a conductive element in the substrate, wherein the conductive interconnect has a via portion coupled to the conductive element and has a trench portion over the via portion, wherein the trench portion is wider than the via portion, and wherein a bottom of the trench portion facing the substrate is separated from the second dielectric layer.

20. The method of claim 19, wherein the first dielectric layer has a first K-value that is smaller than a second K-value of the second dielectric layer, and the third dielectric layer has a third K-value that is smaller than the second K-value.

* * * * *